US008822993B2

(12) United States Patent
Cooney, III et al.

(10) Patent No.: US 8,822,993 B2
(45) Date of Patent: Sep. 2, 2014

(54) INTEGRATED CIRCUIT INCLUDING SENSOR STRUCTURE, RELATED METHOD AND DESIGN STRUCTURE

(75) Inventors: Edward C. Cooney, III, Jericho, VT (US); Jeffrey P. Gambino, Westford, VT (US); Zhong-Xiang He, Essex Junction, VT (US); Tom C. Lee, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/550,813

(22) Filed: Jul. 17, 2012

(65) Prior Publication Data

US 2014/0021469 A1    Jan. 23, 2014

(51) Int. Cl.
H01L 23/58 (2006.01)
H01L 21/66 (2006.01)
H01L 23/48 (2006.01)
G01R 31/28 (2006.01)

(52) U.S. Cl.
CPC .............. *H01L 22/34* (2013.01); *H01L 22/30* (2013.01); *H01L 23/48* (2013.01); *G01R 31/2858* (2013.01)
USPC ...... 257/48; 257/415; 257/414; 257/E21.531; 257/E21.522; 257/E23.01; 438/14; 438/17; 438/12; 438/5; 438/6; 324/539; 324/719; 324/718

(58) Field of Classification Search
CPC ......... H01L 22/34; H01L 22/30; H01L 22/32; H01L 22/00; H01L 22/12; H01L 21/67288; H01L 21/67242; H01L 2924/3511; H01L 23/48; H01L 23/585; G01R 31/2858; G01R 31/2896

USPC .............. 257/48, 415, 414, E23.01, E21.531, 257/E21.53, E21.522, E21.524; 438/14, 17, 438/614, 5, 6, 10, 11, 12, 18; 324/539, 754, 324/719, 718, 765

See application file for complete search history.

(56) References Cited

U.S. PATENT DOCUMENTS

| 5,262,719 | A | 11/1993 | Magdo |
| 6,747,445 | B2 | 6/2004 | Fetterman et al. |
| 7,164,149 | B2 | 1/2007 | Matsubara |
| 7,250,311 | B2 | 7/2007 | Aoki et al. |
| 7,301,239 | B2 | 11/2007 | Wang et al. |
| 7,622,737 | B2 | 11/2009 | Farooq et al. |
| 2009/0201043 | A1* | 8/2009 | Kaltalioglu ................. 324/765 |

OTHER PUBLICATIONS

Edelstein et al., "Comprehensive Reliability Evaluation of a 90 nm CMOS Technology with Cu/PECVD Low-K BEOL," 2004, pp. 316-319.
Rathore et al., "Copper, Low-K, Dielectrics, and Their Reliability," 2004, pp. 4.1-4.14.
Ray et al., "Qualification of Low-K 65nm Technology Die with Pb-Free Bumps on a 2-2-2 Laminate Package (PBGA) with Pb-free Assembly Processes," 2007, 7 pages.

* cited by examiner

*Primary Examiner* — Chuong A Luu
*Assistant Examiner* — Moazzam Hossain
(74) *Attorney, Agent, or Firm* — David A. Cain; Hoffman Warnick LLC

(57) ABSTRACT

An Integrated Circuit (IC) and a method of making the same. In one embodiment, an integrated circuit includes: a substrate; a first metal layer disposed on the substrate and including a sensor structure configured to indicate a crack in a portion of the integrated circuit; and a second metal layer disposed proximate the first metal layer, the second metal layer including a wire component disposed proximate the sensor structure.

13 Claims, 9 Drawing Sheets

INTEGRATED CIRCUIT INCLUDING SENSOR STRUCTURE, RELATED METHOD AND DESIGN STRUCTURE

FIELD OF THE INVENTION

The disclosure relates generally to integrated circuit (IC) wafers and fabrication, and more particularly, to an IC including a set of sensor structures disposed within a layer of the IC and configured to sense cracks in the IC, a related method of forming, and a design structure.

BACKGROUND

In integrated circuit (IC) design, a plurality of materials, orientations, and components may be employed by designers to customize and create various ICs. These designs may include the use of copper wire, aluminum wire, silicon layers and many other kinds of components and materials. Standard IC chip fabrication includes the use of Back End Of Line (BEOL) wires to form components such as inductors in and upon ICs. However, as a result of component proximity and/or variances in material properties (e.g., thermal expansion rates) between components such as BEOL wires and silicon, stresses may form in the IC during fabrication. As the IC is subjected to several thermal cycles during fabrication, these stresses may lead to deformation, cracking, and/or IC failure. In some ICs, designers may call for larger wires in designs, thereby enabling larger currents and the creation of discrete structures. However, as components and/or wire sizes increase, the stresses which may be imparted through the differing coefficients of thermal expansion may also increase, resulting in an increase in IC failures (e.g., cracks). Detection of these failures (e.g., cracks) may be difficult, imprecise, and unreliable, requiring complex analysis of each IC manufactured. The complexity of crack detection in current IC chip fabrication technology limits IC inspection and chip design options, and increases the likelihood that malfunctioning and defective ICs go undetected by fabricators and quality analysts.

BRIEF SUMMARY

A first aspect of the disclosure provides an integrated circuit including: a substrate; a first metal layer disposed on the substrate and including a sensor structure configured to indicate a crack in a portion of the integrated circuit; and a second metal layer disposed proximate the first metal layer, the second metal layer including a wire component disposed proximate the sensor structure.

A second aspect of the disclosure provides a method including: forming a first wiring layer on a substrate, the first wiring layer including a sensor structure; forming a second wiring layer on the substrate above the first wiring layer, the second wiring layer including a wire component located proximate the sensor structure; transmitting an electrical current through the sensor structure, the electrical current passing from a first end of the sensor structure to a second end of the sensor structure; obtaining the electrical current at the second end of the sensor structure; and analyzing the electrical current at the second end of the sensor structure to determine a condition of the second wiring layer.

A third aspect of the disclosure provides a design structure tangibly embodied in a machine readable medium for design, manufacturing, or testing an integrated circuit on a wafer, the design structure including: a substrate; a first metal layer disposed on the substrate and including a sensor structure configured to indicate a crack in a portion of the integrated circuit; and a second metal layer disposed proximate the first metal layer, the second metal layer including a wire component disposed proximate the sensor structure.

BRIEF DESCRIPTION OF THE DRAWINGS

The above and other aspects, features and advantages of the disclosure will be better understood by reading the following more particular description of the disclosure in conjunction with the accompanying drawings.

It is noted that the drawings of the disclosure are not necessarily to scale. The drawings are intended to depict only typical aspects of the disclosure, and therefore should not be considered as limiting the scope of the disclosure. It is understood that elements similarly numbered between the FIGURES may be substantially similar as described with reference to one another. Further, in embodiments shown and described with reference to FIGS. 1-9, like numbering may represent like elements. Redundant explanation of these elements has been omitted for clarity. Finally, it is understood that the components of FIGS. 1-9 and their accompanying descriptions may be applied to any embodiment described herein.

DETAILED DESCRIPTION

Figure 1:
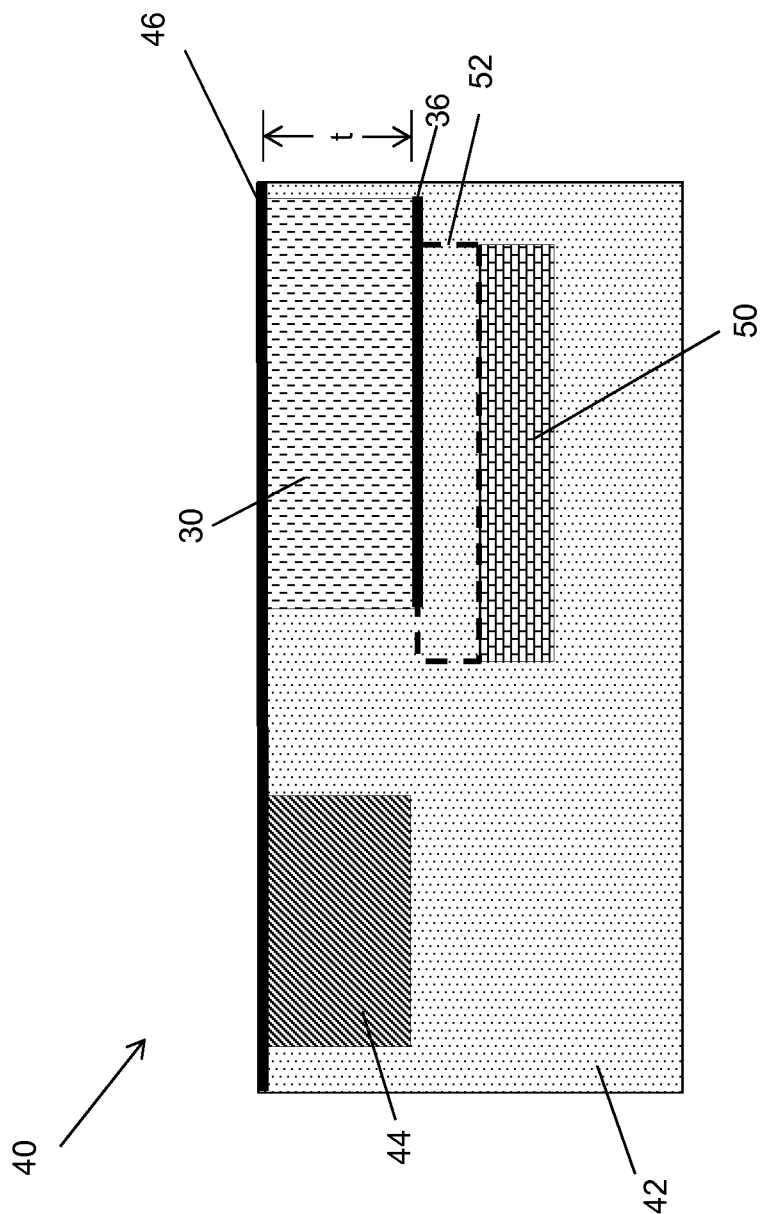
FIG. 1 shows a cross-sectional side view of a portion of an integrated circuit according to embodiments of the invention.

Turning to the drawings, FIG. 1 shows a cross-sectional side view of a portion of an integrated circuit (IC) 40 including a sensor structure 50 (e.g., a wire, a metal layer, etc.) disposed in a substrate 42 and located proximate a wire component 30 (e.g., a wire, a metal layer, etc.) according to embodiments. A dielectric layer 36 (e.g., silicon nitride) may be disposed beneath wire component 30 and above sensor structure 50. A second structure 44 (e.g., a metal layer, a wire, etc.) may be formed proximate wire component 30 and a second dielectric layer 46 upon and/or within substrate 42. Wire component 30 may include any number of copper wires/layers in connection with one another. In one embodiment, wire component 30 may have a thickness 't' of greater than about 6 micrometers (μm). Sensor structure 50 may be configured to fracture and/or deform in order to indicate a crack in IC 40, substrate 42, and/or wire component 30. This indication may be based on a variation in a characteristic (e.g., change in current carrying capacity, resistance, electrical conductance, etc.) of sensor structure 50. Propagation of a crack in substrate 42 may proceed to contact and fracture sensor structure 50, thereby indicating the presence of the crack.

Sensor structure 50 may be configured to pass an electrical current through a portion of IC 40. The electrical current passing from a first end 730 (shown in FIG. 8) of sensor structure 50 to a second end 732 (shown in FIG. 8) of sensor structure 50. In one embodiment, analysis of the electrical current obtained at second end 732 of sensor structure 50 may indicate a condition of any of IC 40, substrate 42, and/or wire component 30. This indication may include a variation in previously obtained and/or expected characteristic value (e.g., a conductive characteristic, a resistance, a current carrying capacity, etc.) of sensor structure 50. Sensor structure 50 may include at least one of copper or aluminum.

In an embodiment, sensor structure 50 may have a serpentine or woven shape beneath wire component 30. Sensor structure 50 may include a bending, curled, and/or spiral pattern, proximate wire component 30 with increased exposure to wire component 30, thereby increasing potential exposure to crack propagation and formation. Sensor structure 50 may be located proximate and physically distinct and/or isolated from wire component 30. In one embodiment, a portion 52 (shown in phantom) of sensor structure 50 may extend to contact wire component 30 and/or dielectric layer 36.

Figure 2:
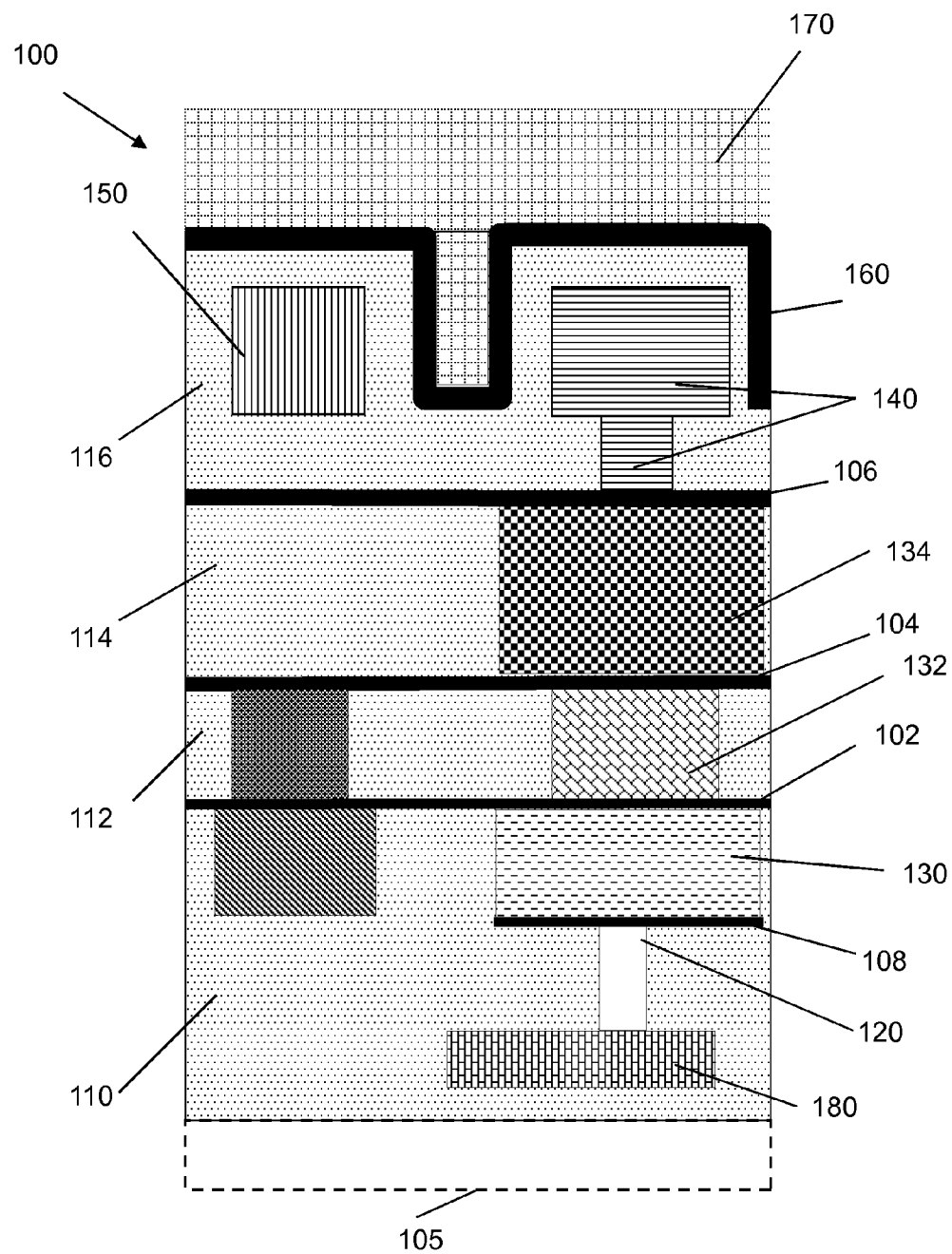
FIG. 2 shows a cross-sectional side view of a portion of an integrated circuit according to embodiments of the invention.

FIG. 2 shows a cross-sectional side view of a portion of an integrated circuit (IC) 100 including a first metal layer (e.g., a sensor structure 180) disposed in a first dielectric layer 110 and located proximate a second metal layer (e.g., a wire component 130) according to embodiments. A set of processing/secondary dielectric layers 110, 112, 114, 116, and 170, may be deposited upon a substrate 105 (shown in phantom), and a series of back end of line (BEOL) processes may be performed, including deposition of a first set of dielectric layers 102, 104, 106, and 160, a set of processing/secondary dielectric layers 110, 112, 114, 116, and BEOL elements 130, 132, 134, 140, and 150 (e.g., a device wire 94). First set of dielectric layers 102, 104, 106, 108, and 160, and processing/secondary dielectric layers 110, 112, 114, and 116, may be comprised of, for example, silicon nitride, silicon-carbon-oxide, silicon oxide, hafnium oxide, or other insulating materials used in semiconductor fabrication. In one embodiment, set of BEOL elements 130, 132, 134, 140, and 150, may be formed and/or installed on, in, and/or between first set of dielectric layers 102, 104, 106, 108, and 160, as part of the BEOL processes. In one embodiment, BEOL elements 130, 132, 134, 140, and 150, may include an inductor and/or a transformer. A person skilled in the art will readily recognize that location of set of BEOL elements 130, 132, 134, 140, and 150, may be adjusted or modified to meet design and/or performance needs. Further, it is understood that other structures have been omitted for clarity. The omitted structures may include any conventional interconnect components, passive devices, etc. It is understood that front end of line (FEOL) processing generally refers to a portion of the manufacturing process in which individual components and devices are patterned in substrate 105, and that BEOL generally refers to a portion of the manufacturing process in which components and devices on substrate 105 and/or processing/secondary dielectric layers 110, 112, 114, 116, and 170, are interconnected through wiring, metallization etc. The BEOL processes may include photoresist technique, etching or any other known or to be developed techniques.

In an embodiment, sensor structure 180 may be communicatively connected to a via 120 located proximate BEOL elements 130, 132, 134, 140, and 150. Sensor structure 180 may be configured to fracture and/or deform in order to indicate a crack in IC 100, substrate 105, and/or processing/secondary dielectric layers 110, 112, 114, 116, and 170. This indication may be based on a variation in a characteristic (e.g., change in current carrying capacity, resistance, electrical conductance, etc.) of sensor structure 180. In one embodiment, a crack in processing/secondary dielectric layer 116 may propagate and proceed to contact sensor structure 180, fracturing sensor structure 180 and thereby indicating the presence of the crack/changing a characteristic of sensor structure 180.

In an embodiment, sensor structure 180 may have a serpentine shape beneath wire component 130. In this embodiment, sensor structure 180 is formed in a bending, curled, and/or spiral pattern, forming a sensor structure 180 proximate wire component 130, thereby increasing potential exposure to cracks.

Any of substrate 105, and processing/secondary dielectric layers 110, 112, 114, 116, and 170, may be comprised of but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 105 and layers 110, 112, 114, 116, and 170, may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 105, as illustrated and described, are well known in the art and thus, no further description is necessary.

First set of dielectric layers 102, 104, 106, 108, and 160, and processing/secondary dielectric layers 110, 112, 114, 116, may include silicon dioxide ($SiO_2$), silicon nitride (SiN), or any other suitable material. Any number of dielectric layers may be located over the IC/chip body, as many other layers included in semiconductor chips now known or later developed. In one embodiment, first dielectric layers 102, 104, 106, 108, and 160, and processing/secondary dielectric layers 110, 112, 114, 116, may include silicon dioxide ($SiO_2$) for its insulating, mechanical and optical qualities. First dielectric layers 102, 104, 106, 108, and 160, and processing/secondary dielectric layers 110, 112, 114, 116 may include, but are not limited to: silicon nitride ($Si_3N_4$), fluorinated $SiO_2$ (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK™ (a polyarylene ether available from Dow Chemical Corporation), a spin-on silicon-carbon containing polymer material available from JSR Corporation, other low dielectric constant (<3.9) material, or layers thereof. First dielectric layers 102, 104, 106, 108, and 160, and processing/secondary dielectric layers 110, 112, 114, 116, may be deposited using conventional techniques described herein and/or those known in the art.

As used herein, the term "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Sensor structure 180 may be formed in first dielectric layer 110 through etching or any other known means. In one embodiment, etching may be performed using a reactive ion etch (RIE). As is known in the art of semiconductor fabrication, RIE uses chemically reactive plasma to remove material deposited on wafers/substrates. Differences in width between these openings may allow for utilizing a phenomenon known as inverse RIE lag. Inverse RIE lag, as is known in the art of semiconductor fabrication, causes a faster etch rate in narrower openings (higher aspect ratios) than in openings having larger widths (lower aspect ratios). Inverse RIE lag may be induced under any conditions characterized by high polymerization and high wafer self-bias voltages. In one embodiment, conditions characterized by high polymerization, may include general chemistries such as CxHyFz (Carbon-Hydrogen-Flourine) with high oxide-to-nitride selectivity (where the blanket etch rate ratio is greater than approximately 20:1). In another embodiment, conditions characterized by high polymerization may include $O_2$ (oxygen), a dilutant, and one or more of: $C_4F_6$, $C_5F_8$, or $C_4F_8$. In this case, the dilutant may be, for example, Argon (Ar). High wafer self-bias voltages may, for example, be voltages greater than approximately 500 volts. While specific conditions for facilitating inverse RIE lag are described herein, those conditions are merely illustrative. Inverse RIE lag may be induced under other conditions not specifically described herein. It is understood that IC 100 may be subjected to a single or multiple metallization processes at any time during formation.

Figure 3:
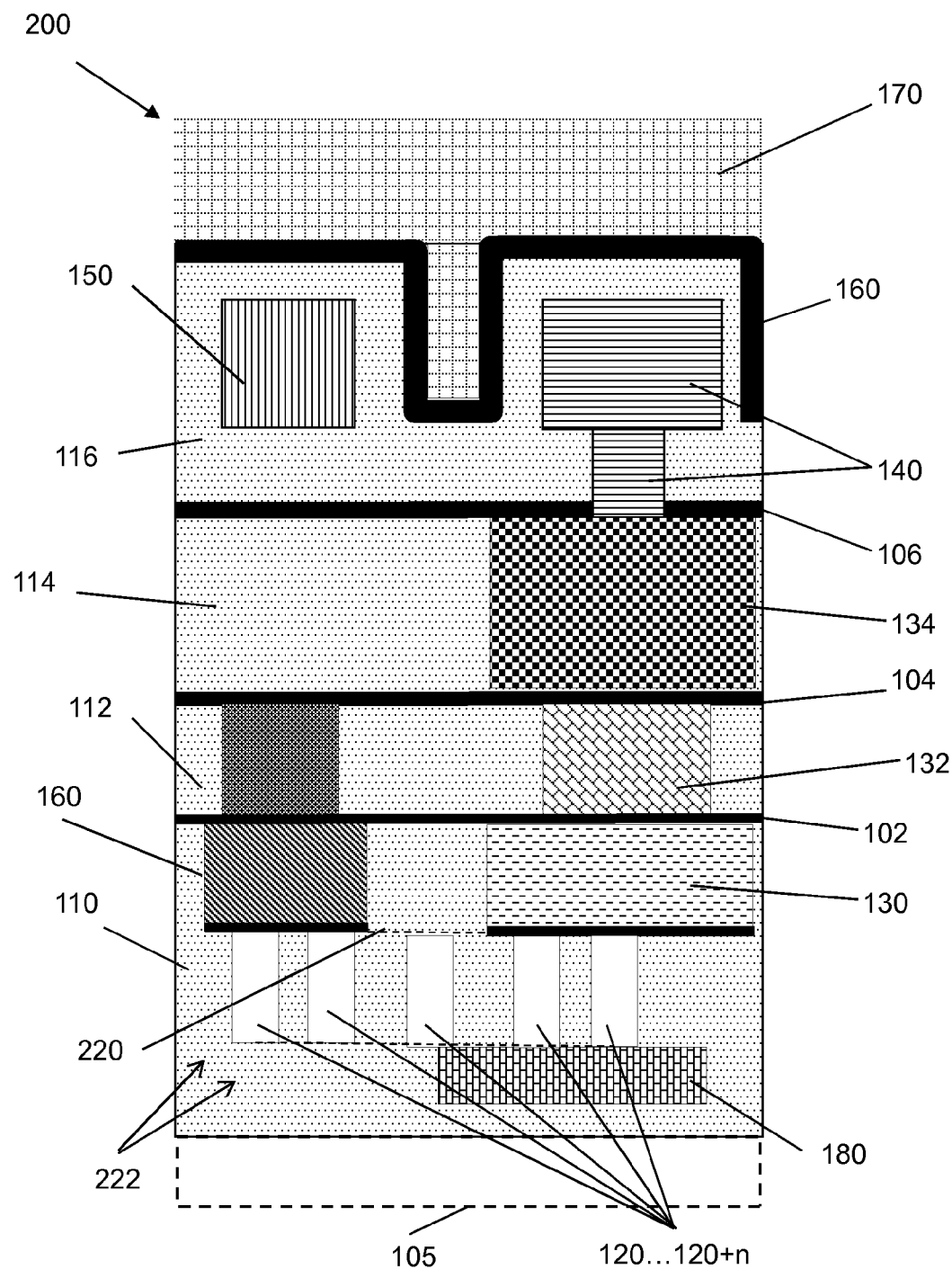
FIG. 3 shows a cross-sectional side view of a portion of an integrated circuit according to embodiments of the invention.
Figure 4:
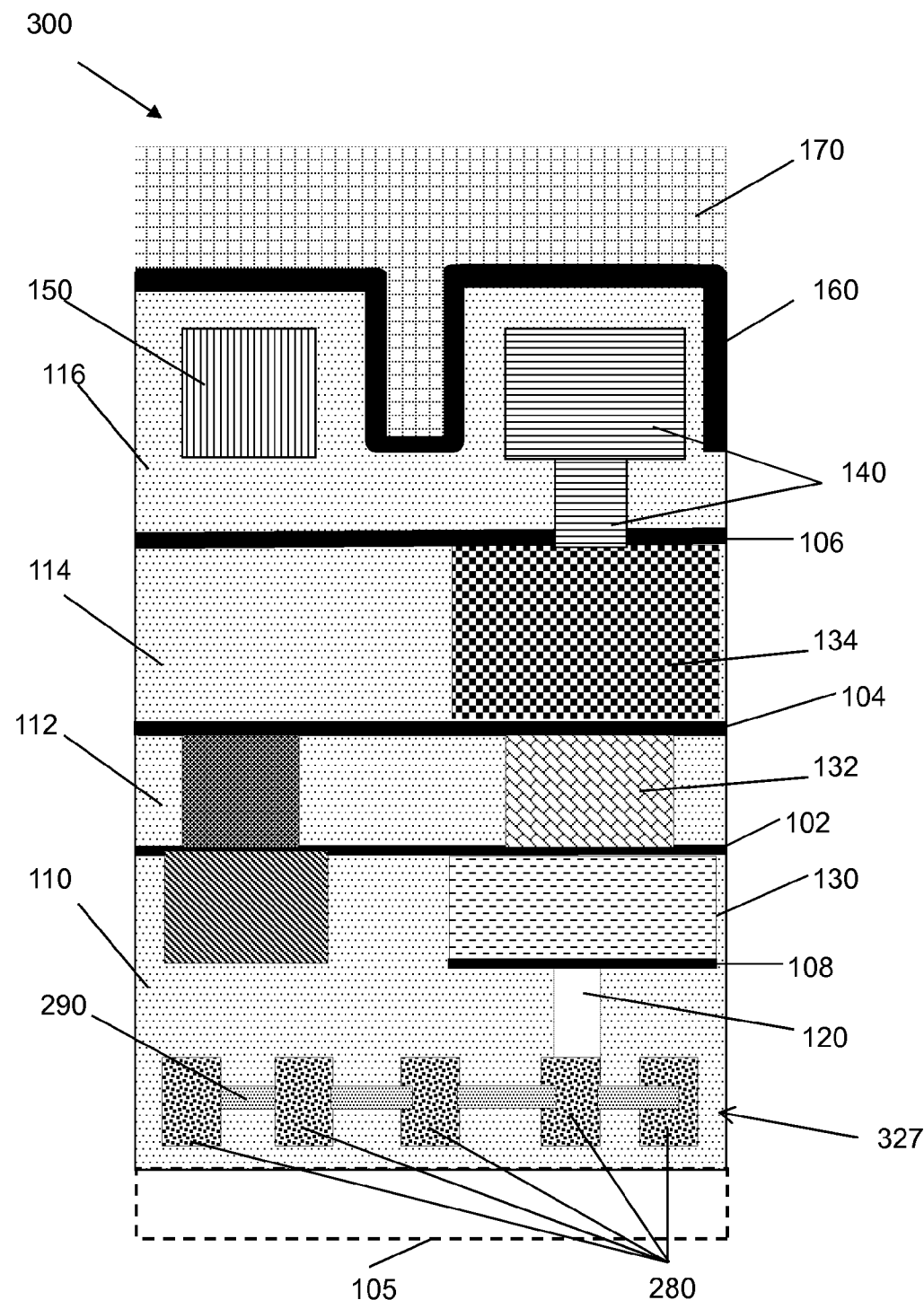
FIG. 4 shows a cross-sectional side view of portions of an integrated circuit according to embodiments of the invention.

Turning to FIG. 3, a cross-sectional side view of portions of an integrated circuit (IC) 200 including a set of via links (e.g., a plurality of vias 120 . . . 120+n) disposed beneath a BEOL element 160 and wire component 130, and configured to sense cracks in first dielectric layer 110 and/or IC 200 is shown according to embodiments. Via links 120 . . . 120+n may be communicatively connected to sensor structure 180 and configured to relay an indication of crack formation thereto. Set of via links 120 . . . 120+n may be located proximate BEOL element 160 and wire component 130 and may be fragile (e.g., configured to fracture in response to a crack in IC 200). Fracture of set of via links 120 . . . 120+n may effect a characteristic of (e.g., varying a conductive characteristic of) sensor structure 180. In one embodiment, plurality of vias 120 . . . 120+n may be connected through a channel 220 (shown in phantom) to form a via chain 222 connected to sensor structure 180. In another embodiment, plurality of vias 120 . . . 120+n may be communicatively connected to one another through sensor structure 180. In another embodiment, shown in FIG. 4, an IC 300 may include a sensor structure 327 including a set of wires 280 shaped in a pattern (e.g., grid, weave, serpentine, etc.) beneath wire component 130. In one embodiment, set of wires 280 of sensor structure 327 may be communicatively connected to one another through a communication wire 290. In an embodiment, sensor structure 327 may be connected to wire component 130 and/or dielectric layer 108 through a via 120.

Figure 5:
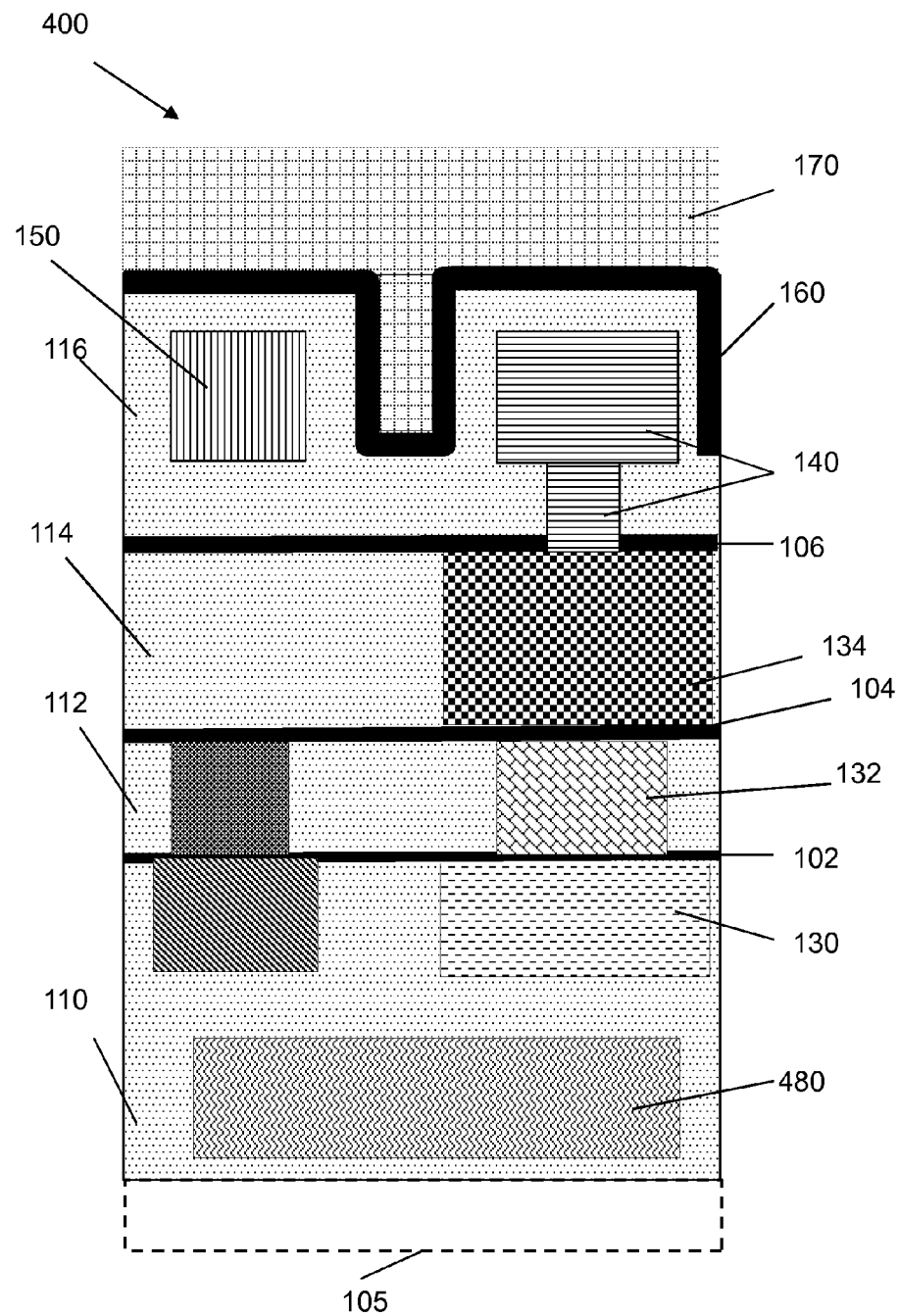
FIG. 5 shows a cross-sectional side view of portions of an integrated circuit according to embodiments of the invention.

Turning to FIG. 5, a cross-sectional side view of portions of an integrated circuit (IC) 400 including a sensor structure 480 with a serpentine shape is shown according to embodiments. In this embodiment, sensor structure 480 is positioned proximate wire component 130 with an orientation which curves serpentine sensor structure 480 beneath wire component 130 for enhanced exposure to crack formation and propagation.

Figure 6:
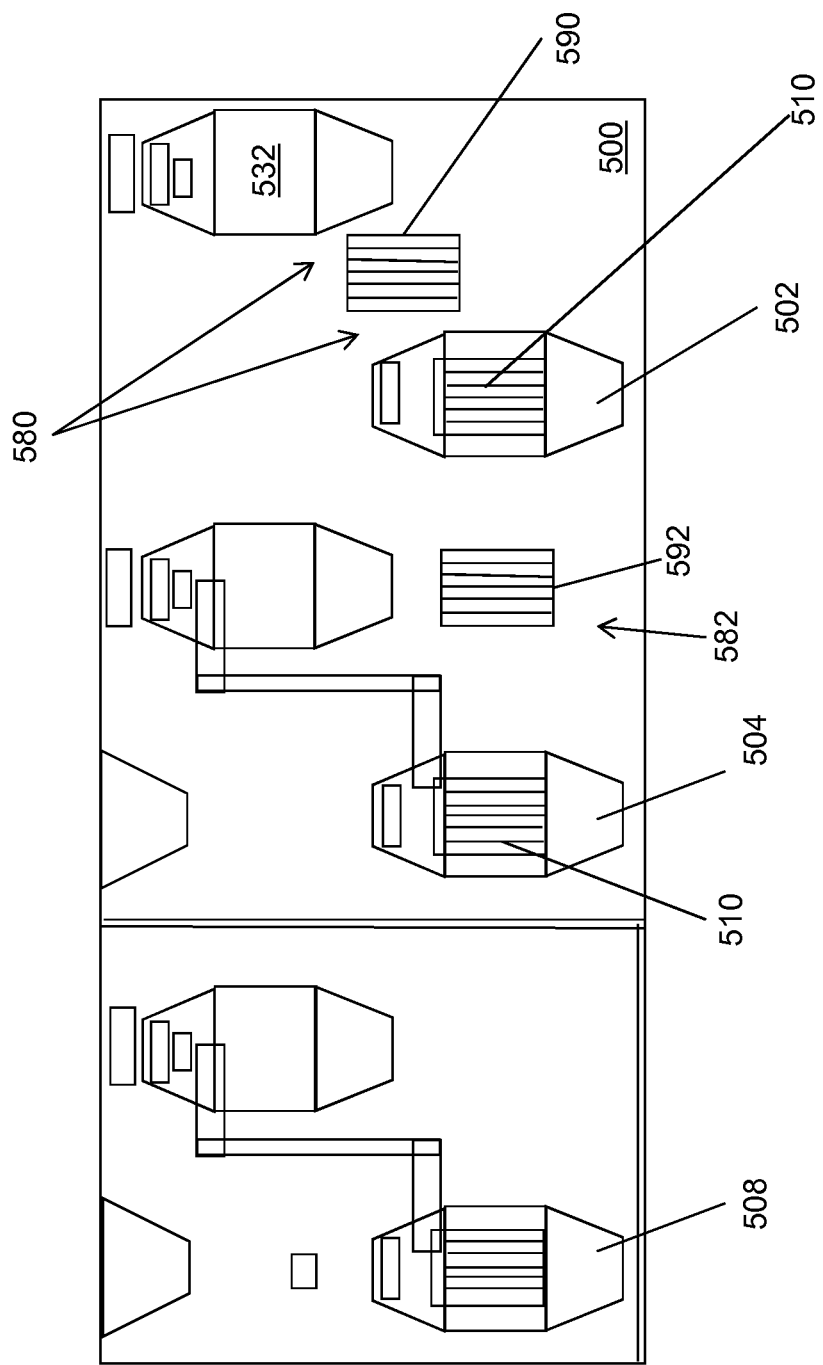
FIG. 6 shows a cross-sectional side view of a portion of a wafer according to embodiments of the invention.

Turning to FIG. 6, an embodiment of a portion of an integrated circuit 500 (e.g., a chip, a wafer portion, an IC chip, etc.) including a set of connecting pads or points 502, 504, 508, and 532, (e.g., a within chip C4, a bump, a wirebond, a copper pillar, etc.) is shown in accordance with embodiments of the disclosure. Connecting pads 502, 504, and 508, may connect portions of integrated circuit 500 to an electrical signal/pulse which signals and/or transmits power to and through integrated circuit 500 and circuits thereon. In this embodiment, a set of sensor structures 510 are located within, between, and/or beneath each of connecting pads 502, 504, and 508. Sensor structure 510 may be configured to form a grid and/or serpentine structure within and/or beneath a portion of connecting pads 502, 504, and 508, thereby monitoring an area about the connection point for crack formation and/or propagation. In one embodiment, integrated circuit 500 may include a first kerf sensor structure 590 located in a kerf 580 between adjacent connecting pads 502 and 532. First kerf sensor structure 590 may include a plurality of wires configured to deform and/or fracture in response to crack formation. A second kerf sensor structure 592 may be located in a second kerf 582 proximate either or both of connecting pads 502 and 504, and configured to indicate a crack between and/or in either or both of connecting pads 502 and 504.

Figure 7:
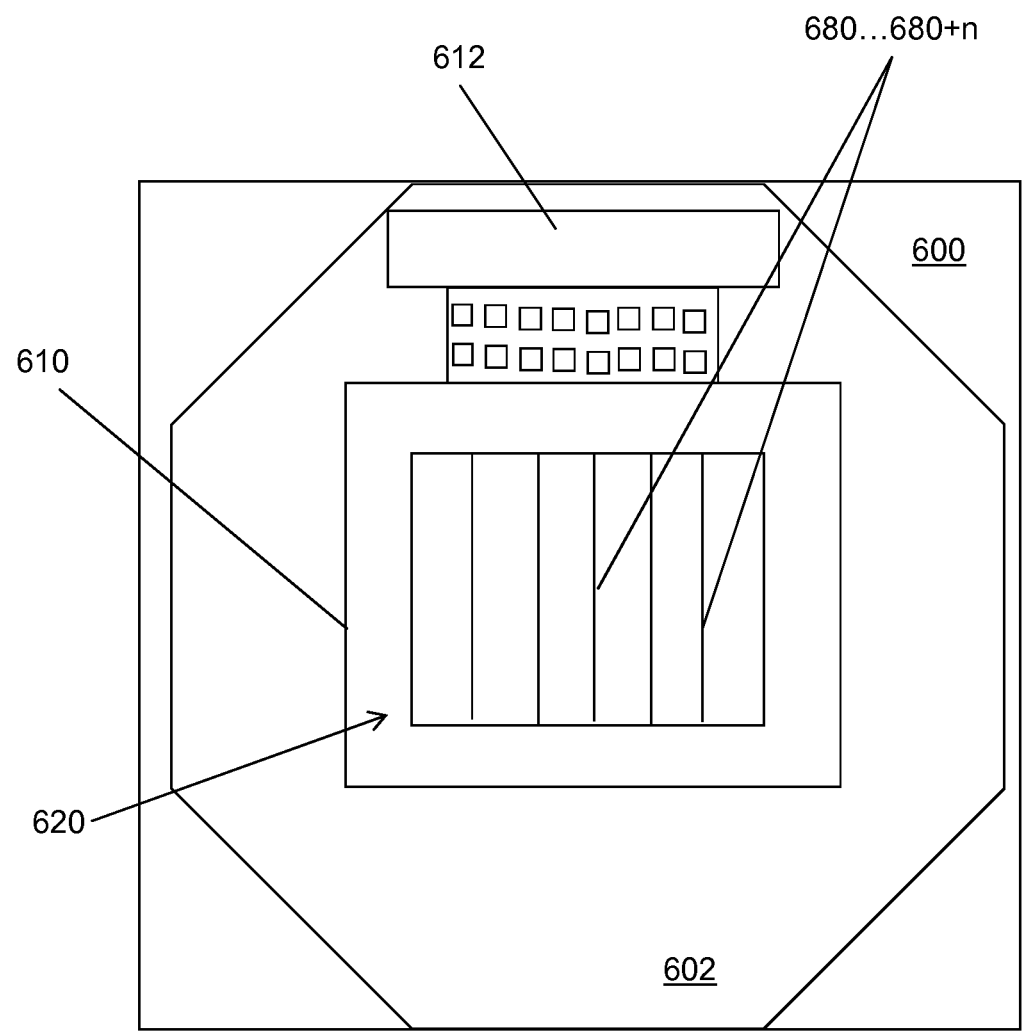
FIG. 7 shows a cross-sectional side view of a portion of a wafer according to embodiments of the invention.

Turning to FIG. 7, an embodiment of a portion of an integrated circuit 600 including a connecting pad 602 (e.g., a within chip C4, a bump, a wirebond, a copper pillar, etc.) is shown in accordance with embodiments of the disclosure. In this embodiment connecting pad 602 includes and/or is disposed above a sensor structure 610 with a net/grid 620 of sensor wires 680. During fabrication, sensor structure 610 may be located proximate wire component 130 (shown in FIG. 2), and be configured to indicate a crack in wire component 130 and/or proximate BEOL elements 130, 132, 134, 140, and 150. Net/grid 620 may include a plurality of wires 680 . . . 680+n communicatively connected to one another and oriented to form a grid beneath portions of wire component 130.

Figure 8:
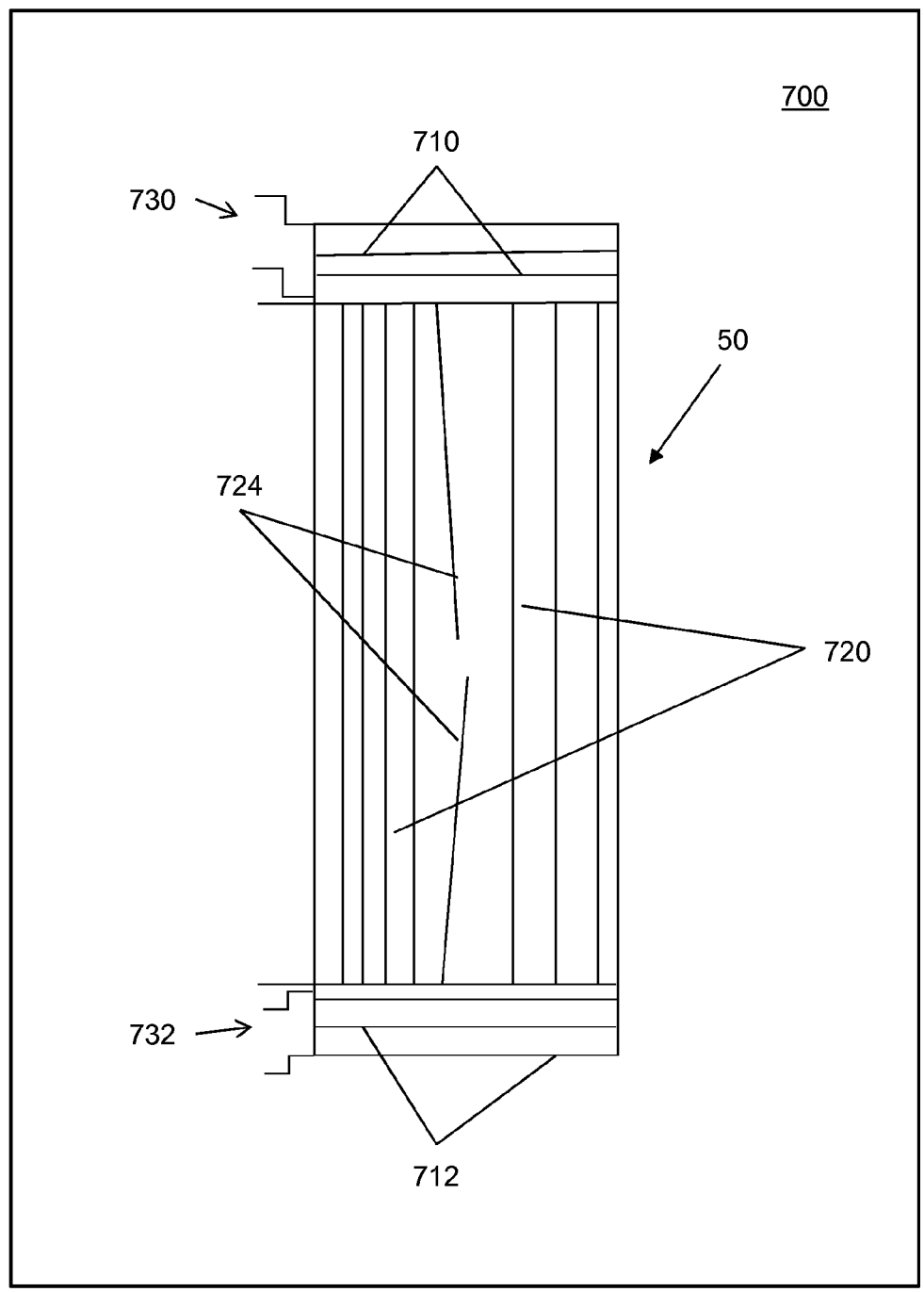
FIG. 8 shows a cross-sectional side view of a portion of a wafer according to embodiments of the invention.

Turning to FIG. 8, an embodiment of a portion of a wafer 700 including a sensor structure 50 is shown in accordance with embodiments of the disclosure. In this embodiment, sensor structure 50 includes a first end 730 communicatively connected to a second end 732 through a plurality of wires 720. Plurality of wires 720 may be communicatively connected through a first set of communication wires 710 and a second set of communication wires 712. An electrical current/voltage may be introduced at first end 730 and passed through sensor structure 50 and out through second end 732. The electrical current/voltage may be obtained at second end 732 and analyzed to determine a condition of wire component 130 (shown in FIG. 2) and/or a portion of wafer 700. Analysis of the electrical current/voltage at second end 732 may include comparing a characteristic of the received electrical current/voltage to a characteristic of the known input electrical current/voltage at first end 730. Variances between the electrical current/voltage at first end 730 and second end 732 may indicate a condition of wire component 130 and/or a portion of wafer 700. In one embodiment, a wire 724 in plurality of wires 720 may fracture and/or crack as a result of a crack in wafer 700, wire component 130, and/or components proximate sensor structure 50. Fracture of wire 724 may block and/or vary a characteristic of the electrical current as it passes through sensor structure 720, thereby, indicating a crack.

Figure 9:
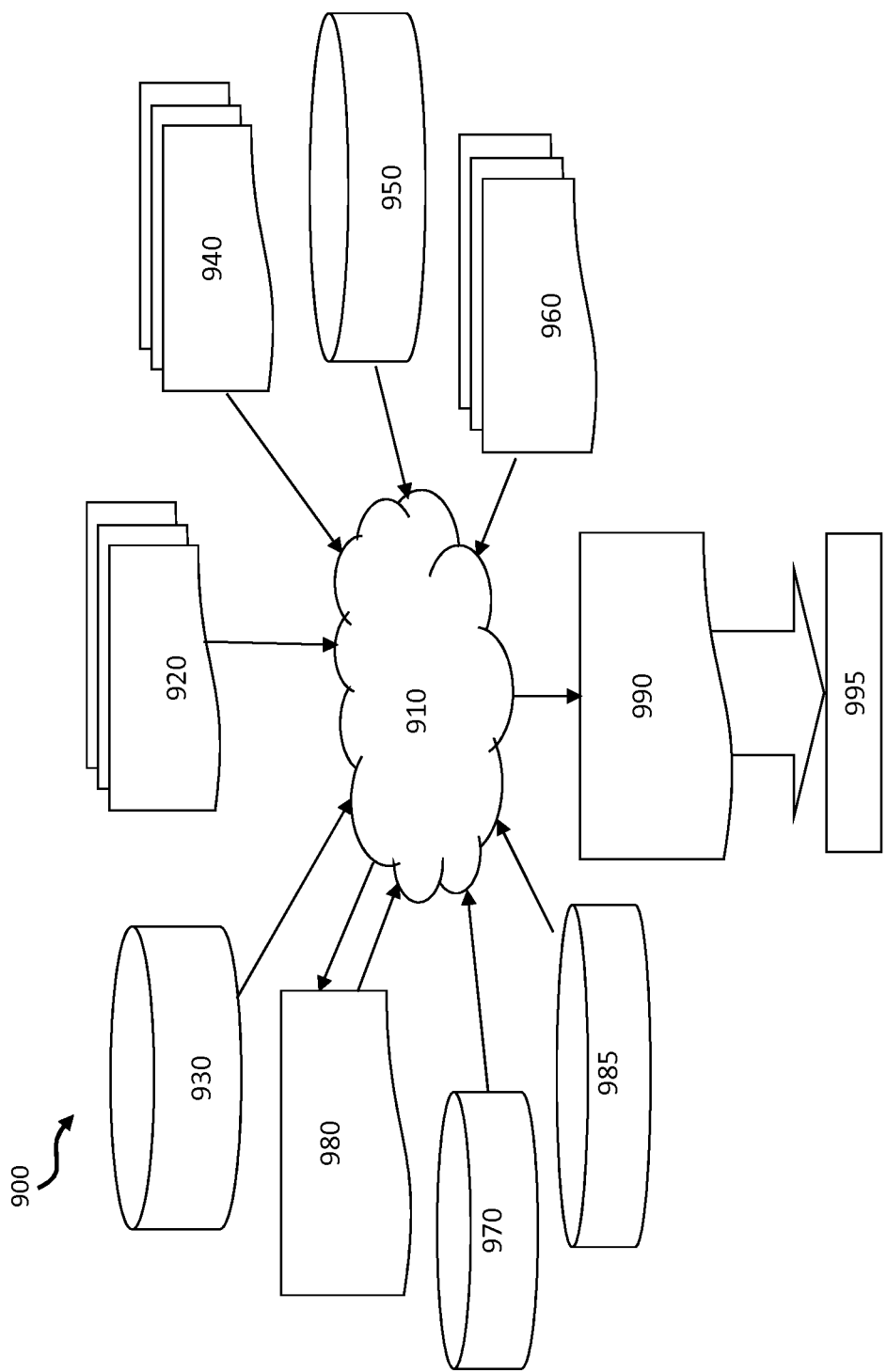
FIG. 9 is a flow diagram of a design process used in semiconductor design, manufacture, and/or test according to embodiments of the invention.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 990 may comprise a compiled, executable HDL simulation model that functionally simulates the devices shown in FIGS. 1-8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both subsurface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An integrated circuit comprising:
a substrate;
a first metal layer disposed on the substrate and including a sensor structure configured to indicate a condition of a portion of the integrated circuit, wherein the sensor structure includes a set of via links configured to fracture in response to a crack in the integrated circuit, each of the via links connected to each other through at least one channel to form a chain of interconnected via links; and
a second metal layer disposed proximate the first metal layer, the second metal layer including a wire component disposed proximate the sensor structure, wherein some of the via links in the set of via links have ends disposed between the first metal layer and the second metal layer and other via links in the set of via links have ends in a location that are outside a vertical correspondence formed between a position of the first metal layer with respect to a position of the second metal layer.

2. The integrated circuit of claim 1, wherein the sensor structure has a serpentine shape.

3. The integrated circuit of claim 1, wherein the sensor structure includes a plurality of net wires communicatively connected and oriented to form a grid proximate the second metal layer.

4. The integrated circuit of claim 1, wherein the wire component includes a plurality of metal layers.

5. The integrated circuit of claim 1, wherein the first metal layer is formed in a kerf between a set of connecting pads on the integrated circuit.

6. The integrated circuit of claim 1, wherein the wire component has a thickness greater than about 6 micrometers (μm).

7. The integrated circuit of claim 1, wherein the sensor structure is configured to conduct an electrical current from a first end of the sensor structure to a second end of the sensor structure, a characteristic of the conduction of the electrical current dependent upon a proximity of the sensor structure to a crack in the second wiring layer.

8. The integrated circuit of claim 1, wherein fracture of the set of via links varies a conductive characteristic of the sensor structure.

9. A design structure tangibly embodied in a machine readable medium for design, manufacturing, or testing an integrated circuit on a wafer, the design structure comprising:
a substrate;
a first metal layer disposed on the substrate and including a sensor structure configured to indicate a crack in a portion of the integrated circuit, wherein the sensor structure includes a set of via links configured to fracture in response to a crack in the integrated circuit, each of the via links connected to each other through at least one channel to form a chain of interconnected via links, wherein the fracture of the set of via links varies a conductive characteristic of the sensor structure; and
a second metal layer disposed proximate the first metal layer, the second metal layer including a wire component disposed proximate the sensor structure, wherein some of the via links in the set of via links have ends disposed between the first metal layer and the second metal layer and other via links in the set of via links have ends in a location that are outside a vertical correspondence formed between a position of the first metal layer with respect to a position of the second metal layer.

10. The design structure of claim 9, wherein the sensor structure includes a plurality of net wires communicatively connected and oriented to form a grid proximate the second metal layer.

11. The design structure of claim 9, wherein the sensor structure has a serpentine shape and the wire component has a thickness greater than about 6 micrometers (μm).

12. The design structure of claim 9, wherein the sensor structure is configured to conduct an electrical current from a first end of the sensor structure to a second end of the sensor structure, a characteristic of the conduction of the electrical current dependent upon a proximity of the sensor structure to a crack in the second wiring layer.

13. The design structure of claim 9, wherein the first metal layer is formed in at least one of: a kerf between a set of integrated circuits on the wafer or a layer beneath the second metal layer of the integrated circuit.

\* \* \* \* \*